United States Patent [19]

Ottenstein

[11] 4,064,555
[45] Dec. 20, 1977

[54] GASOLINE PUMP MODIFICATION APPARATUS

[75] Inventor: Allan S. Ottenstein, Houston, Tex.

[73] Assignee: Research Fuels, Inc., Houston, Tex.

[21] Appl. No.: 726,585

[22] Filed: Sept. 27, 1976

[51] Int. Cl.² .................. G09F 13/14; B67D 5/22; G09F 9/32

[52] U.S. Cl. .................. 364/465; 40/132 R; 340/366 E

[58] Field of Search ............... 235/151.34; 340/324 R, 340/366 E; 222/23; 40/130 E, 28 L, 132 R, 130 B, 130 C, 52 R

[56] References Cited

U.S. PATENT DOCUMENTS

| 3,261,013 | 7/1966 | Naylor | 340/378 |
|---|---|---|---|
| 3,813,527 | 5/1974 | Langston | 235/151.34 |
| 3,864,861 | 2/1975 | Hill, Jr. | 40/132R |
| 3,878,377 | 4/1975 | Brunone | 235/151.34 |
| 3,894,658 | 7/1975 | Buell, Jr. | 235/151.34 X |
| 3,895,738 | 7/1975 | Buchanan et al. | 235/151.34 X |
| 3,918,052 | 11/1975 | Bricher | 340/366 E |
| 3,949,207 | 4/1976 | Savary et al. | 235/151.34 |

Primary Examiner—Edward J. Wise
Attorney, Agent, or Firm—Donald Gunn

[57] ABSTRACT

An apparatus for modification of a gasoline pump is disclosed. This apparatus incorporates electronically driven display numerals. The numerals are supported on a PC board recessed within a housing. They are slanted at an angle approximating 45°. They are recessed into the housing and are surrounded by a nonreflective flat back housing incorporating an overhanging eyebrow and right and left shields. The recess further includes a generally horizontal flat cheek plate extending from the face of the panel back to the numeral display. The numeral is so arranged that it can be viewed from a substantial distance without ambiguities or distractions as a result of glare, and is otherwise highly visible. A circuit for driving the electronic numerical display is incorporated.

7 Claims, 8 Drawing Figures

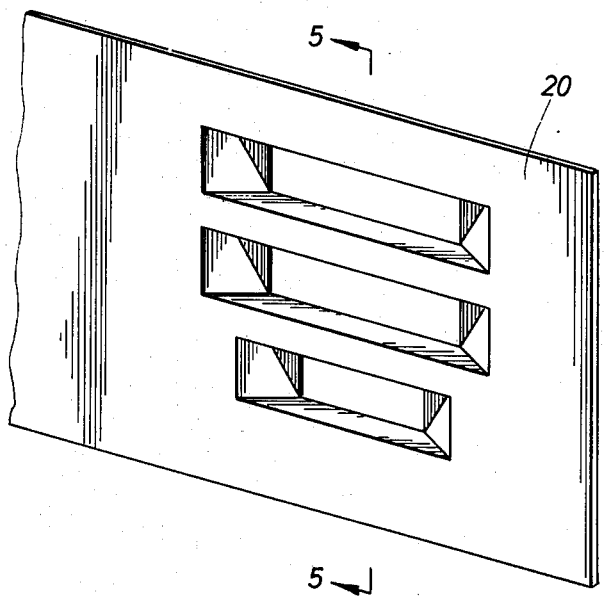
FIG. 4
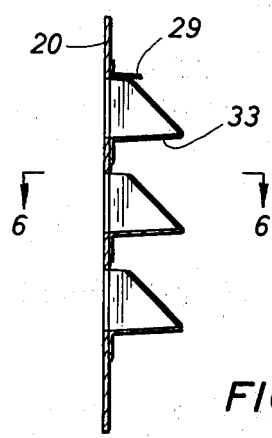
FIG. 5
FIG. 6
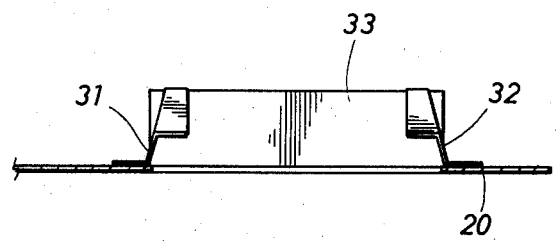
FIG. 7
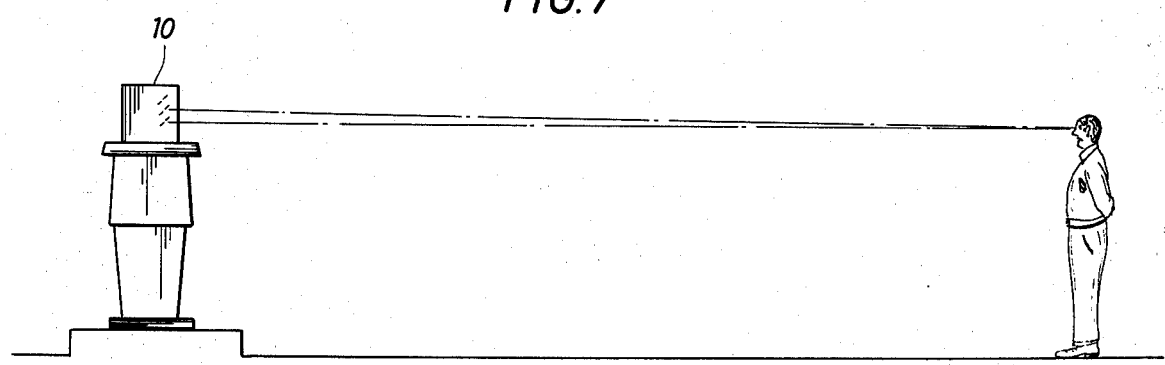

GASOLINE PUMP MODIFICATION APPARATUS

BACKGROUND OF THE PROBLEM

Most gasoline dispensing pumps heretofore have used mechanical gear trains to provide price multiplication. They indicate the total value of a sale by forming a visible signal which is indicative of the sale. This is obtained from a flow meter of some form which rotates a shaft, thereby rotating a set of gears. Price multiplication is accomplished in the gear system after receiving the price per gallon as an input. The result is the display of a price which is obtained by rotation of certain rotatable wheels having price numbers painted on the periphery of the wheels.

With the advent of self service stations, it is helpful to provide electronic repeaters at a remote location. It is somewhat difficult to arrange an electronic repeater where the basic source of the data is in fact a mechanical wheel rotated by a gear system and which is read by visual inspection. The use of a repeater is advantageous in self service stations where a single operator tends the cash register and reads repeaters for 8 or 10 pumps. Accordingly, the equipment of the present invention has multiple advantages, one being the adaptbility of this invention with a remote electronically driven price repeater.

The present invention is a convertor for use with a gasoline pump which has a mechanical or gear driven price multiplier. This equipment is adapted to be placed on top of a pre-existing pump. It incorporates a housing which holds the visible numeral displays which form the numbers of the price. This is particularly useful in view of the changeable background lighting and environment of filling station pumps.

Mechanical multipliers utilizing price wheels with numbers painted thereon do not have the reliability of the device which is disclosed herein. The present invention provides a more legible and flexible convertor; accordingly, it is able to be installed on a pump housing. It is disclosed herein as an attachment which is particularly suitable for positioning on top of a gasoline pump housing. Where the pump is a double pump, duplicate sets of equipment in the housing can be incorporated. A readout is provided on the front and back. It is not limited to being an accessory; in addition, it can be initially constructed in the cabinet of a pump housing. Accordingly, the representation of this invention as an accessory is not to be treated as a limitation thereon.

The present invention utilizes gas discharge planar display devices formed into seven segments to visibly indicate the decimal digits, thereby indicating price per gallon, quantity sold, and the total price. These numbers are visually flashed by the multi-segment displays.

SUMMARY OF THE DISCLOSURE

This disclosure is directed to an electronic display for gasoline pumps. The apparatus utilizes gas discharge planar display devices to form the numbers which are highly visible over great distances. In particular, it incorporates a housing featuring an overhanging eyebrow and right and left shields adjacent to a sloping multi-segment display. The face panel is painted a flat black to avoid reflections. The absence of reflections which is obtained as a result of the use of the disclosed equipment forms numbers which are quite easily read at great distances, free of glare and other distractions as a result of the construction herein disclosed. A circuit for converting pulses into driving signals for the apparatus and for multiplying the price by the measure of the delivery is also disclosed.

DESCRIPTION OF THE DRAWINGS

FIG. 4 is a perspective view of the face plate which shields the numeric displays;

FIG. 5 is a sectional view through the face plate of FIG. 4 showing the construction of the rearwardly extending eyebrow and display mount;

FIG. 6 is a top view of the face plate showing the construction of the right and left shields and a cheek plate;

FIG. 7 shows the installation of the present invention on top of a gasoline pump and in particular illustrating lines of sight for a distant observer.

DESCRIPTION OF THE PREFERRED EMBODIMENT

Figure 1:
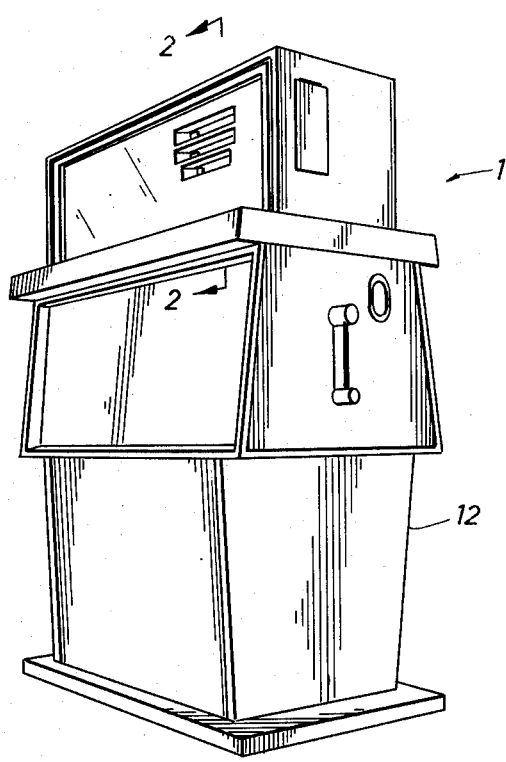
FIG. 1 is a perspective view showing the present invention affixed as an attachment on top of a conventional gasoline pump and in particular showing a window where the displays are seen for the benefit of a customer.

Attention is first directed to FIG. 1 of the drawings. In FIG. 1, the numeral 10 identifies the present invention in the form of an attachment. It is not so limited but it is shown in this disclosure as an attachment affixed to the top of a conventional gasoline pump 12. The gasoline pump may or may not have a mechanical price multiplier which indicates the price per sale. It does include a pump and a flow meter which forms pulses at a rate related to the volume of gasoline sold. A scale factor will be presumed, and the scale factor preferably is 100 pulses per gallon. Within the scope of the present disclosure, the scale factors can be varied and this variation can be accommodated by incorporating a rate multiplier integrated circuit component. This will be ignored for the moment.

Figure 2:
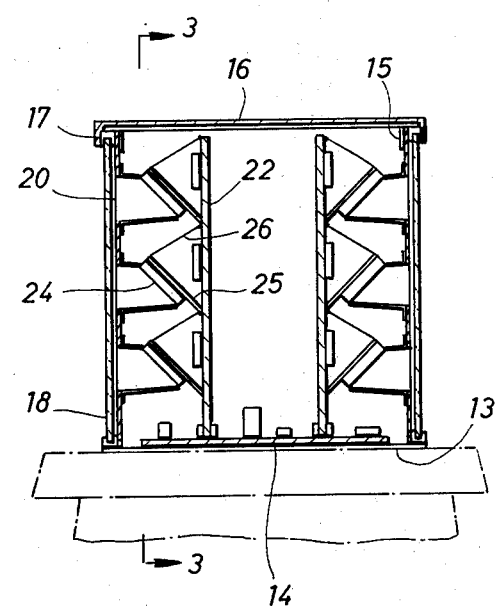
FIG. 2 is a side view of the present invention with the cover removed illustrating internal details of construction of the numeric displays mounted on a PC board adjacent to a recessed structure on a face plate.
Figure 3:
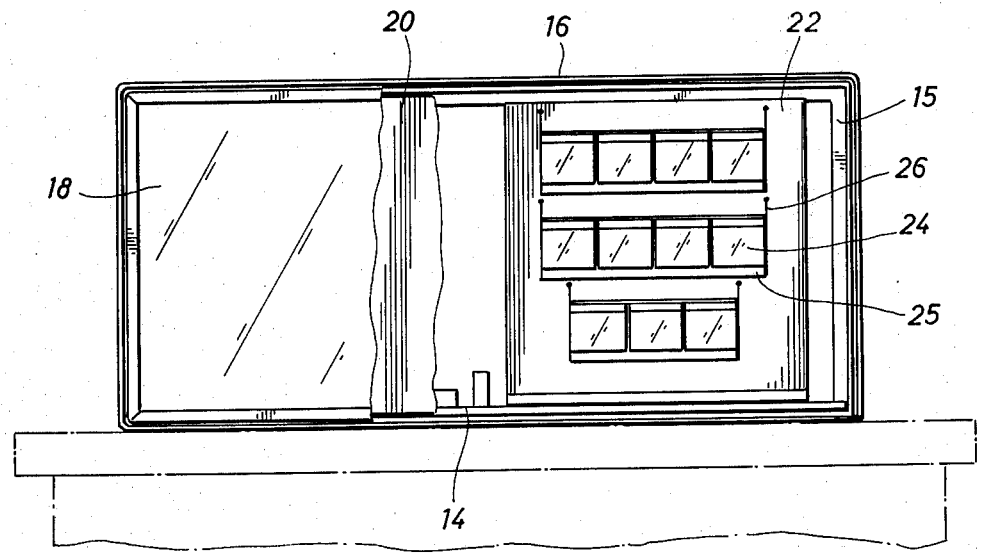
FIG. 3 is a sectional view along the line 3—3 of FIG. 2 showing internal details of construction of the PC board which supports the numeric displays.

In FIG. 2 of the drawings, the present invention is shown in better detail. It includes a bottom mounting plate 13 which supports a printed circuit board 14. The apparatus includes a surrounding metal framework indicated by the numeral 15. Without going into excessive detail, the framework includes vertical and horizontal frame members which support an external cabinet or housing 16. The cabinet or housing is equipped with an overhang to define a recessed slot 17. The slot 17 is constructed and arranged to support a glass pane 18 which is positioned immediately adjacent to a face plate 20. The face plate 20 is perforated at a number of locations as will be described.

The PC board 14 serves as a mother board for an upstanding PC board 22. Two such upstanding boards are shown in FIG. 2. They are equipped with the numeric displays to be described, and duplicate boards are incorporated so that the pump provides a price read out to the front and back. It is presumed that the pump 12 of FIG. 1 is a single pump and accordingly two such displays are incorporated. Sometimes, two dispensing hoses are incorporated in a single pump housing and in this event, four such numeric displays are normally included. In any case, they are all constructed in similar fashion and therefore a description of the PC card 22 and the numeric display supported by it will suffice for the remainder of the equipment.

The channel or slot 17 is equipped with a gasket to seal against the intrusion of rain. The lid or external frame cover 16 of the apparatus overhangs so as to prevent the intrusion of rain water. On the interior, the electronic gear is thus kept safe and dry.

The numeral 24 identifies a gas discharge planar display. It has a height which is typically in the range of about one-half to two inches, depending on size purchased, and a suitable size of about 1 to 1½ inches is selected. It is supported on a sloping mounting plate 25. The mounting plate 25 is connected to suitable conductive leads placed on the PC board 22. It can be connected via a plug and socket to the PC board 22. The mounting plate 25 is positioned at an angle by a support rod 26. The rod 26 is preferably duplicated at the two corners of the mounting plate 25. The mounting plate 25 is thus held at an angle with respect to the vertical. The preferable angle is 45°. The angle can be increased further almost to the point of laying the display 24 in the horizontal but at this point, it will become difficult to read. This also tends to shorten the number to a viewer who is approximately at eye level height with the display. No sacrifice is involved as long as the angle does not exceed about 45°. Inclination of the mounting plate 25 at a greater angle seems to relatively fatten the number viewed by the observer but it does not appear to prevent correct reading of the number until the angle becomes excessive. This disclosure thus includes a useable angular inclination of about 30° to about 60°. They are not hard and fast; they are practical in the actual use.

The number which is displayed at 24 thus is a part of the price or cost indicia which is flashed to the reader. It is flashed through a hole or opening in the face plate 20. The plate 20 is equipped with left and right shields and an overhanging eyebrow adjacent to a cheek plate which all collectively form an opening through which the numeric display 24 is viewed.

If the face plate 20 were provided with a hole formed in it but it had no overhanging eyebrow substantial problems would arise on reading the number at some distance. The problems generally would relate to glare and reflections. Accordingly, the incorporation of the equipment to be described cuts down on the glare and reflections. It improves the intelligence obtained by the viewer and cuts down on ambiguities.

A face plate is shown in greater detail in FIGS. 4, 5 and 6 considered jointly. A piece of sheet stock 29 forms an overhanging eyebrow above each opening. It will be understood that three measures are conveyed to the reader, the values being price per gallon, total gallons sold, and total price. Each hole has its own designated opening and accordingly, the face plate 20 is printed with suitable legends to identify to the reader the importance of the values which the reader can observe through the openings. The overhanging eyebrow plate is made of sheet stock and is affixed to the back side of the face plate. It preferably extends rearward by a distance to enable it to contact the top end of the numeric display 24. It is preferable to have it extend over to abutting contact with the display 24; if it terminates short of it, this leaves a gap above the display which will permit stray light to enter. When stray light does enter, it tends to wash out the number and creates reflections which are distractive.

The eyebrow plate thus overhangs the number presented by the display 24. It additionally overhangs a pair of end tabs which are bent rearwardly and which are called respectively the left hand shield 31 and the right hand shield 32. They are symmetrically contructed and face one another. They are located at the ends of the slot. The two shields extend from the back side of the face 20 to a point which is behind the display 24. They prevent the intrusion of light from the right and left ends.

The opening for each display further includes what will be called a cheek plate 33. The cheek plate 33 is appended to the face plate 20 and extends approximately horizontally to the rear. It has a width or depth which extends to the bottom edge of the display 24 which is shown better in FIG. 2. This construction preferably avoids or covers over any prospective slots between the displays 24 and the cheek plate 33. This avoids the intrusion of unwanted light from the interior of the cabinet or housing.

As shown in FIGS. 4 and 5 considered jointly, the face plate 20 has three openings which are for three specific values. Each value has a variable length; some can be formed of two digits perhaps, or three or four digits. The number of digits is not critical and can be increased by merely increasing the length of the slot or opening formed in the face plate. This is achieved by making the opening longer, thereby accommodating more numeric displays 24.

It will be observed in FIG. 4 of the drawings that the top two openings are equal in length and normally enclose four numbers while the bottom opening normally encloses three numbers.

The exposed surfaces of the plates at each opening are preferably coated with a black flocking. Optionally, flat black paint can be painted on each surface. However, the preferable approach is not only to paint it flat black but to also include an irregular surface such as that obtained by flocking. This eliminates reflective glare to a viewer.

Use of the present invention is depicted in FIG. 7. The electronic readout equipment is able to be viewed from a very substantial distance. It is placed at a height which is approximately eye level to most adults. It is, however, still readable to a person of short stature or to an individual sitting in a vehicle who has to look up at the numbers. Even in the instance where a person is quite tall and looks down at the numbers in contrast with the generally horizontal line of sight shown in FIG. 7, the numbers are still quite legible even though they might be somewhat disproportionate in the ratio of height to width.

The present invention thus operates in a very direct fashion. A viewer is able to see the numbers which are placed on display. As the numbers are formed by the equipment, they are quickly seen and they are seen at a great distance. They can be viewed at various angles to the right and left without loss of viewing accuracy. In addition, they can be viewed at angles deviating from the horizontal.

Figure 8:
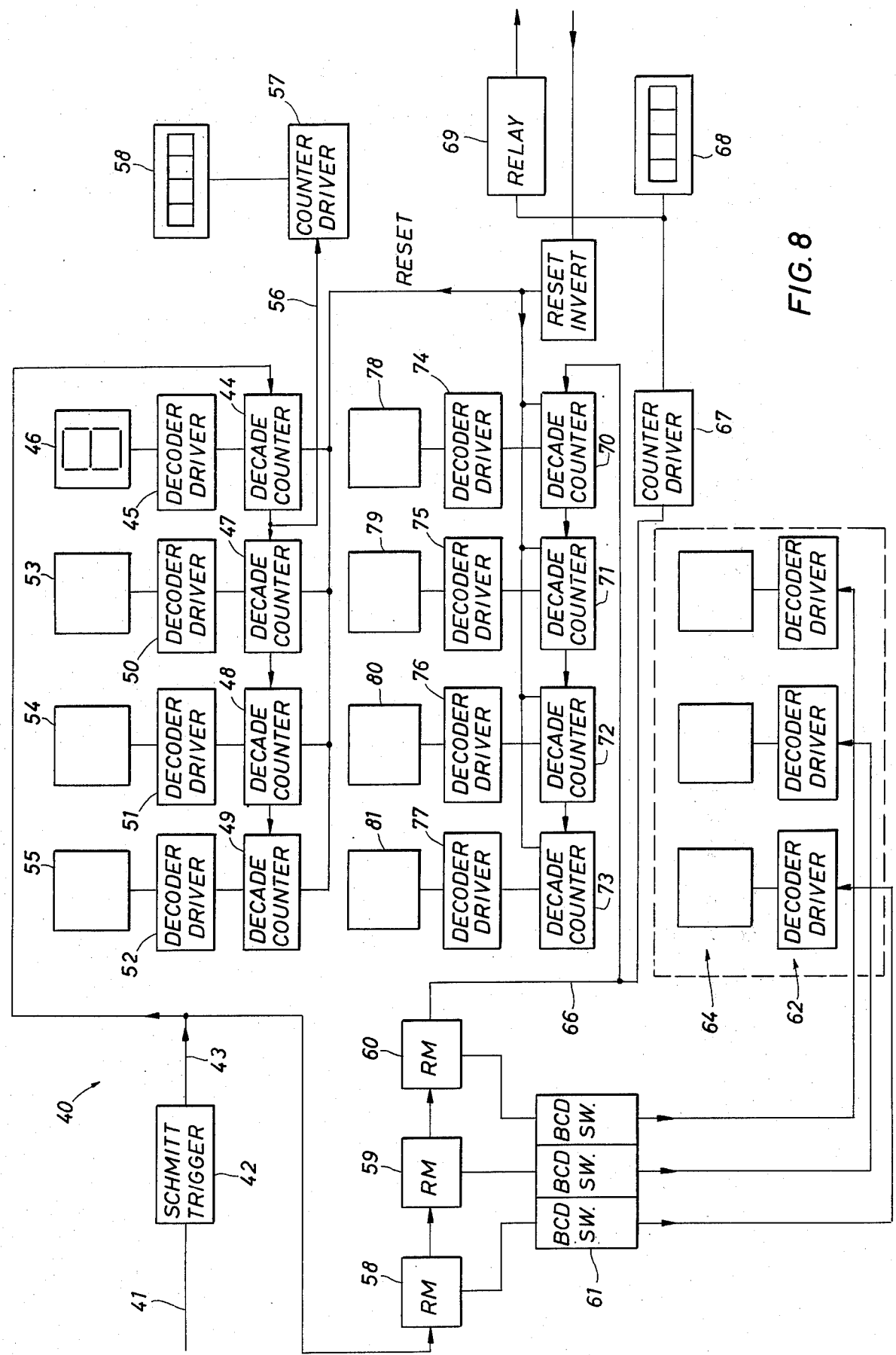
FIG. 8 is a schematic block diagram of the circuitry of the present invention which is driven by pulses from a flow meter.

In FIG. 8 of the drawings, electronic circuitry for driving the numeric displays is shown. It is identified by the referenced numeral 40. The electronic equipment of FIG. 8 is provided with an input conductor 41. This conductor is from a pulse forming circuit. The pulse forming circuit forms a pulse which is scaled to the total volume of liquid which is pumped. The scale factor can be varied; the preferred scale for this embodiment is 100 pulses per gallon. If the scale is something other than 100 pulses, it can be altered to the requested rate of 100 pulses per gallon by the use of a rate multiplier integrated circuit. In any case, it will be presumed that the total gallonage pumped is converted into pulses having a scale factor of 100 pulses per gallon. Typical equipment is a flow meter.

The conductor 41 is connected to a Schmitt trigger 42. It forms an enlarged output pulse when the input pulse occurs. The Schmitt trigger forms a larger amplitude output pulse on a conductor 43. The pulse on the conductor 43 is connected to a decade counter 44. The counter 44 is connected to a decoder driver 45 which is in turn connected to a display 46. The display 46 is installed as a numeric display which has the mechanical appearance and mounting depicted in FIG. 2 of the drawings.

The decade counter 44 is input with 100 pulses per gallon. It forms one output pulse for every 10 input pulses, or a pulse representing one-tenth of a gallon. This is supplied to an additional decade counter 47. That cascades with a subsequent decade counter 48 and a duplicate 49. The four decade counters thus count the total liquid delivery in hundredths, tenths, units, and tens of gallons.

Each of the decade counters thus depicted in FIG. 8 is connected to a decoder driver. The decoder driver 45 was previously identified. Similar equipment is included at decoder drivers 50, 51 and 52. The additional decoder drivers are themselves connected with the numeric displays 53, 54, and 55. Four decades are shown although this can be varied.

It is desirable to incorporate a permanent non-resettable counter which measures in tenths of gallons. To this end, a conductor 56 connects with a counter driver 57. This provides count pulses to a non-resettable register 58. It incorporates an appropriate number of decades as required.

The conductor 43 is additionally input to a rate multiplier 58. Three rate multipliers 58, 59 and 60 are incorporated. They are themselves set to multiplying rates which are input by BCD matrices at 61. The matrices enable the user to input a price per gallon. This is normally a fixed number which may be adjusted occasionally from time to time. It thus becomes something at a fixed variable. The BCD matrix inputs are in the form of switches which form four signals for each decade. The price per gallon is normally given in three decimal accuracy and to this end, the price is normally diplayed to a purchaser. For this reason, decoder drivers at 62 are incorporated and they are in turn connected to numeric displays at 64. This is a fixed display which is visible at all times and which shows the customer the price per gallon to three decades of accuracy.

The rate multipliers are themselves a type of integrated circuit which is a settable counter. As an example, if the price is set to 70 cent per gallon, it forms 70 output pulses which represent 70 cents upon the delivery of 1 gallon. These pulses are formed on a conductor 66. The conductor 66 is connected to a suitable counter driver 67 which in turn connects with a cumulative non-resettable register 68. For remote operations, a relay 69 forms a high level, high current slaved repeater signal for a remote read out.

The conductor 66 is additionally input to a decade counter 70. This provides an output which is a measure of a sale in pennies. A cascade of decade counters is incorporated at 71, 72 and 73. Each decade counter is connected to a decoder driver respectively identified at 74, 75, 76 and 77. These are in turn connected to numeric displays 78, 79, 80 and 81.

The electronic computer shown at 40 in FIG. 8 operates in the following fashion. Before any sale is made, the BCD switches at 61 are first set. This is a value which represents the price per quantity sold typically measured in dollars per gallon. The price is thus set by the operator by adjusting the switches 61. As they are adjusted, the multiplication variables are input to the rate multipliers 58-60. In addition, the decoder drivers at 62 are also operated to form visible numbers at the numeric displays 64. This numeric value is normally displayed in the lower most window of the face panel shown in FIG. 4.

The next step in the use of the device is delivery of gasoline through the pump. A flow meter measures the total gallonage delivered and forms output pulses which are delivered in accordance with a selected scale factor. The preferred scale factor is 100 pulses to represent one gallon. If some other scale factor is used, it can be converted into 100 pulses per gallon to cooperate with the specific circuitry shown in FIG. 8. In any event, the total gallonage is represented by the number of pulses which are received on the conductor 41. As an example, if 12 gallons are dispensed, then 1200 pulses are input to the Schmitt trigger. The Schmitt trigger increases the amplitude of the pulses. The pulses are then fed directly to the cascaded counters 44, 47, 48 and 49. The 1200 pulses are advanced through the register form by the several counters and thereby form indicated symbols at the numeric displays 46, 53, 54, and 55. This then represents the total gallonage delivered. This is normally displayed in the topmost slot of the face panel shown in FIG. 4.

Using the example of 1200 pulses representative of 12 gallons, these pulses are input through the rate multipliers. The rate multipliers form a processing of output pulses on the conductor 66. The pulses are input to the register formed by the counters 70-73. The value in these counters is the dollar value of the sale. In the example given, if the cost is 60 cents per gallon, the exemplary sale will involve $7.20 which value will be displayed. Because the sale is less than $10, there will be a zero displayed at the display 81. The $7.20 value will thus be visible at the four displays 78-81 although the largest decade will represent zero value.

Several advantages arise as a result of the use of this device. For instance, it is shown in a fixed mounting high on the pump. This places it above the level of fumes on the driveway aproned around the service station. This is in accordance with most fire codes which take cognizance of the dangers arising because gasoline fumes settle near the ground and do not extend any higher than 4 feet. This permits the construction of the present apparatus while omitting explosion crew housings and the like.

The device is also advantageous because it can be mounted on a pivot between the pump 12 and the housing. This enables it to be rotated so that it might be easily viewed from the location of the cash register. This enables a single employee to monitor several gasoline pumps on a driveway apron. The equipment which is shown in FIG. 8 preferably assembles onto a fairly PC board and accordingly can be easily mounted in the housing. Moreover, it can be located on the mother board which is normally maintained horizontal while suitable conductors extend to the specific displays on vertical PC boards. This will enable the vertical boards to be easily removed and of course removing the numeric displays. The numeric displays however do not require a lot of service and they do have extremely long life and high reliability. Moreover, they do not require high voltage levels, typically operating in the range of about 175 volts. The current flow is quite small and accordingly, the device is able to function quite nicely in the intended context.

The foregoing is directed to the preferred embodiment of the present invention but the scope thereof is determined by the claims which follow.

I claim:

1. A read-out device supplying price information regarding a sale by a fuel pump which comprises:

a housing having a face plate thereon with openings formed in said face plate;

multi-segment numeric displays visible through the openings in said housing;

a non-glare structure constructed on the back side of the face of said housing extending from an opening through which said numeric display is viewed to shield the numeric display from stray light;

electronic price multiplication means which responds to first and second input signals where one input is representative of the total volume of fuel pumped and the other input is representative of the price per quantity;

means for forming driving signals for said numeric display causing said numeric display to form a price indication which means converts signals from said price multiplication means into the driving signals;

wherein said numeric display comprises a multi-digit arrangement of segmental displays which forms visible numbers;

an overhead eyebrow plate extending from said face plate to said numeric display and terminating at both ends of said numeric display with angled shield members preventing the intrusion of light from the ends; and a generally horizontal plate protruding from the back of said face plate and which plate extends to said numeric display, and which plate is covered with a non-reflective material on its exposed area.

2. The apparatus of claim 1 wherein said numeric display is angularly positioned at about 45° forward tilt.

3. The apparatus of claim 2 including a transparent pane over said face plate.

4. The apparatus of claim 1 including an upright mounting board supporting said numeric displays.

5. The apparatus of claim 4 wherein said numeric displays are angularly supported on said mounting board.

6. The apparatus of claim 5 including a supportive brace connected from said board to said displays.

7. The apparatus of claim 6 wherein said displays have about 45° forward tilt.

* * * * *